United States Patent [19]
Asakawa

[11] Patent Number: 5,382,803
[45] Date of Patent: Jan. 17, 1995

[54] ION INJECTION DEVICE

[75] Inventor: Teruo Asakawa, Yamanashi, Japan

[73] Assignee: Tokyo Electron Limited, Tokyo, Japan

[21] Appl. No.: 889,195

[22] Filed: May 28, 1992

[30] Foreign Application Priority Data

May 28, 1991 [JP] Japan ................................. 3-153860
Jun. 20, 1991 [JP] Japan ................................. 3-175979

[51] Int. Cl.6 ............................................. H02N 13/00
[52] U.S. Cl. ........................... 250/492.21; 250/442.11; 361/234; 279/128
[58] Field of Search ........... 250/492.21, 492.2, 442.11; 361/234; 279/128

[56] References Cited

U.S. PATENT DOCUMENTS 4,873,447 10/1989 Imahashi ........................ 250/492.21
5,179,498 1/1993 Hongoh et al. ..................... 361/234

FOREIGN PATENT DOCUMENTS 62-788460 4/1987 Japan .
62-868370 4/1987 Japan .
12274530 9/1989 Japan .

Primary Examiner—Jack I. Berman
Attorney, Agent, or Firm—Oblon, Spivak, McClelland, Maier, & Neustadt

[57] ABSTRACT

An ion injection device comprises a rotatable holding table for holding a semiconductor wafer, a rotary driving mechanism for rotating the holding table, and a detection device for detecting the position of the wafer. The holding table has a holding portion for electrostatically holding the wafer, and an electrode unit located below the holding portion substantially in parallel with an upper surface of the same. The holding portion is made of a dielectric member, and the electrode unit includes a plurality of electrodes separated from one another. The ion injection device further comprises a power source for applying voltage between the electrodes, a control device for controlling the application and interruption of voltage between the electrodes, and an ion injection unit for injecting ions into the wafer.

7 Claims, 7 Drawing Sheets

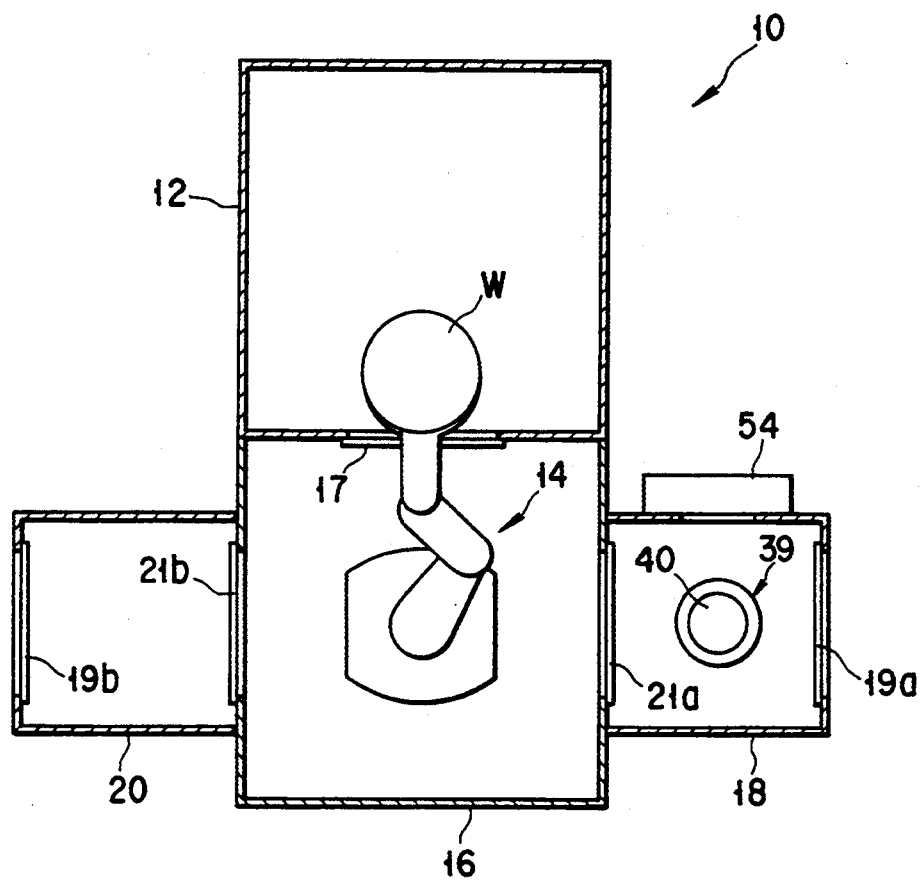
F I G. 1

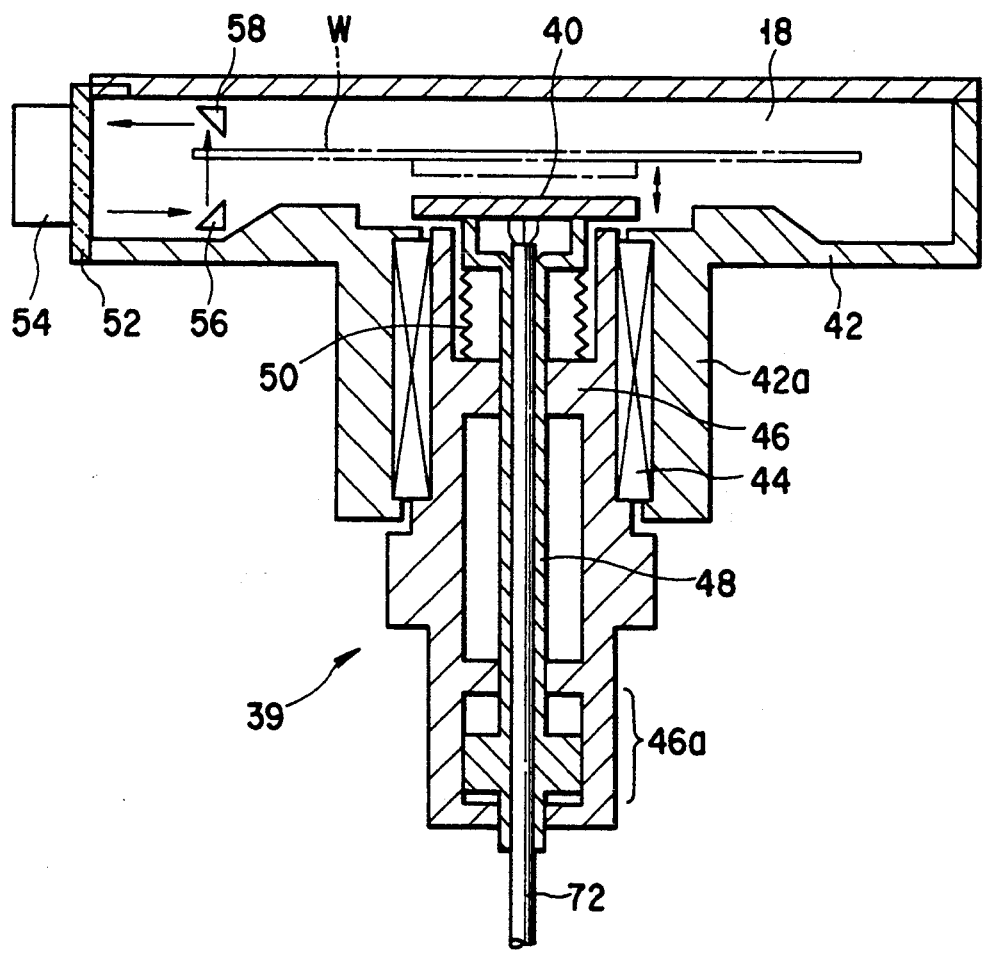
F I G. 3

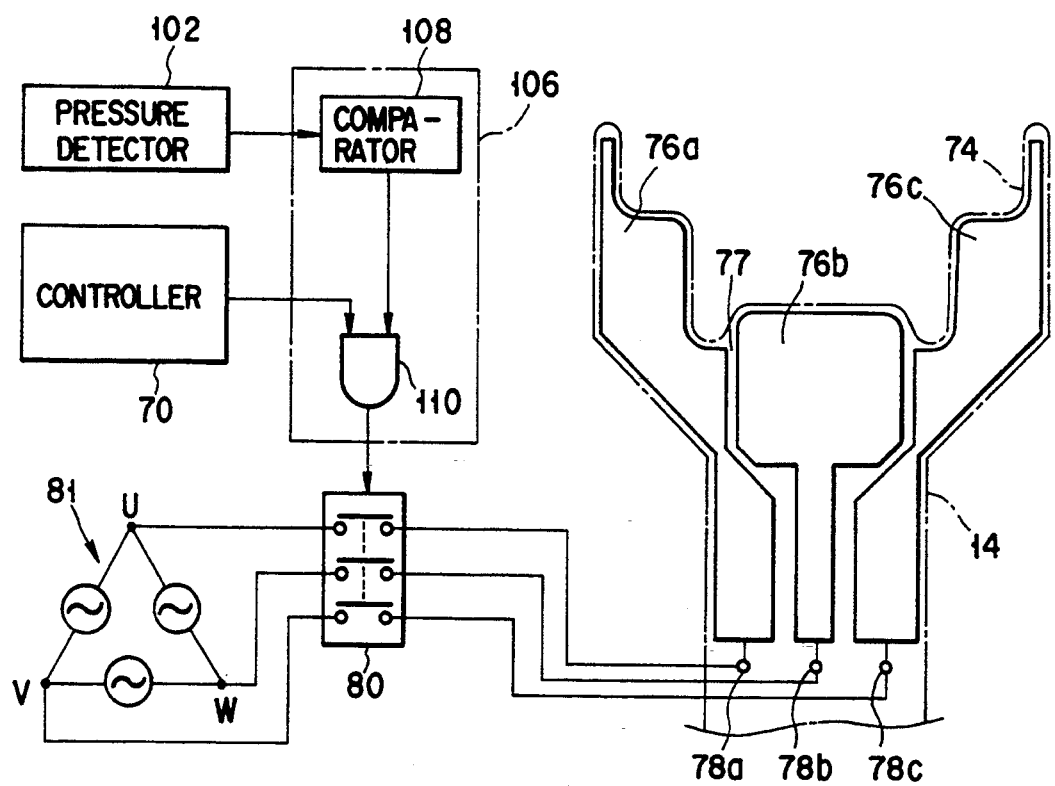
F I G. 6
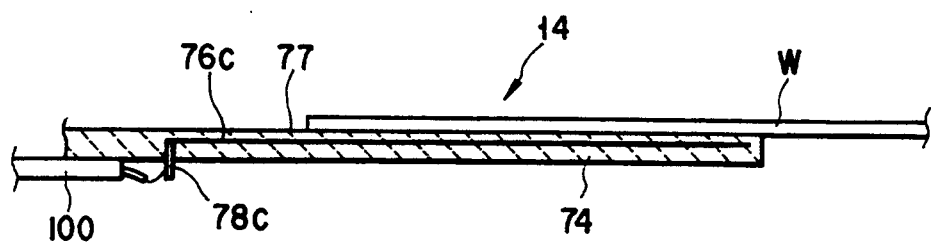
F I G. 7

ION INJECTION DEVICE

BACKGROUND OF THE INVENTION

1. Field of the Invention

This invention relates to an ion injection device, and more particularly to improved wafer-positioning and transfer devices being applicable to the ion injection device.

2. Description of the Related Art

When a semiconductor wafer is treated by an ion injection device, it is necessary to determine the direction of a wafer (i.e., to position the orientation flat of the wafer) since the crystal of the wafer has polarity, and also to align the wafer so as to accurately fix it to the device.

Thus, in the conventional method, a wafer is once placed on the rotatable holding table of a wafer-positioning device located in the air, and held thereon by vacuum sucking. Thereafter, the direction of the wafer and the center position of the same are detected with the holding table rotated, thereby adjusting the position of the wafer. The holding table with the wafer is moved into a vacuum treatment chamber through a load lock chamber, thereby transferring the wafer onto a holding unit contained in the vacuum chamber.

In general, to enhance the efficiency of the system, it is more effective to detect the direction of the wafer under vacuum than in the air.

Actually, however, it is very difficult to locate the positioning device in vacuum atmosphere, because vacuum sucking cannot be utilized in the vacuum atmosphere to hold the wafer on the holding table. If a rubber member or the like having a high friction factor is used to prevent slippage of the wafer, dirt of the rubber member may be adhered to the wafer, or chemical contamination may occur. Further, if the rotational speed or the rotational acceleration of the holding table is high, and/or if the vibration of the same is high, the wafer may slip from its correct position, and may drop therefrom and be broken.

Moreover, in the ion injection treatment device, the wafer is transferred by a transfer arm between a platen on an injection disk, contained in the vacuum treatment chamber add the load lock chamber.

Vacuum sucking cannot be utilized in the transfer arm as in the holding table, so that the wafer has been prevented from slipping, by means of a rubber member of a high friction factor mounted on the arm, or from dropping, by means of an abutment plate or so surrounding the wafer.

However, where a rubber member of a high friction factor is used, dirt of the member may be adhered to the wafer, or dust may be caused from rubber itself, or chemical contamination may occur. Further, when the vibration and/or acceleration of the transfer arm is high, the wafer may slip from its correct position, and may drop from the arm.

On the other hand, where an abutment plate is provided for the transfer arm, a gap may be caused between the plate and wafer, whereby the wafer is moved, and hence may cause dust or be broken, Also, since the tip portion of the arm is thick, the accessibility of the arm to a wafer carrier containing many wafers at a narrow pitch is inevitably deteriorated.

SUMMARY OF THE INVENTION

It is an object of the invention to provided an improved wafer-positioning device for detecting the direction of the wafer and the displacement thereof from the correct position, and then correcting the displacement, for example, in a load lock chamber or vacuum atmosphere in an ion injection device.

It is another object or, the invention to provide an improved transfer device for transferring an object such as a wafer in vacuum atmosphere in an ion injection device.

The first-mentioned object is achieved by a detection device for detecting the position of a semiconductor wafer comprising: a rotatable holding table for holding the wafer thereon; rotary driving means for rotating the holding table; detection means for detecting the position of the wafer; a holding portion provided on the holding table for electrostatically holding the wafer, the holding portion being made of a dielectric member; an electrode unit located below the holding portion substantially in parallel with an upper surface of the holding portion, the electrode unit having a plurality of electrodes separated from one another; voltage application means for applying voltage between the electrodes; and control means for controlling the application and interruption of voltage between the electrodes.

The other object is achieved by a transfer device comprising: a holding member for holding an object to be transferred; a holding portion provided on the holding member for electrostatically holding the object, the holding portion being made of a dielectric member; an electrode unit located below the holding portion substantially in parallel with an upper surface of the holding portion, the electrode unit having a plurality of electrodes separated from one another; voltage application means for applying voltage between the electrodes; and control means for controlling the application and interruption of voltage between the electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a schematic view of an ion injection device according to an embodiment of the invention;

FIG. 3 is a longitudinal sectional view of a wafer-position detection mechanism;

FIG. 6 is a wire diagram of an electrostatic chuck provided on a transfer arm;

FIG. 7 is a cross sectional view of the transfer arm;

DETAILED DESCRIPTION OF THE PREFERRED EMBODIMENT

Figure 2:
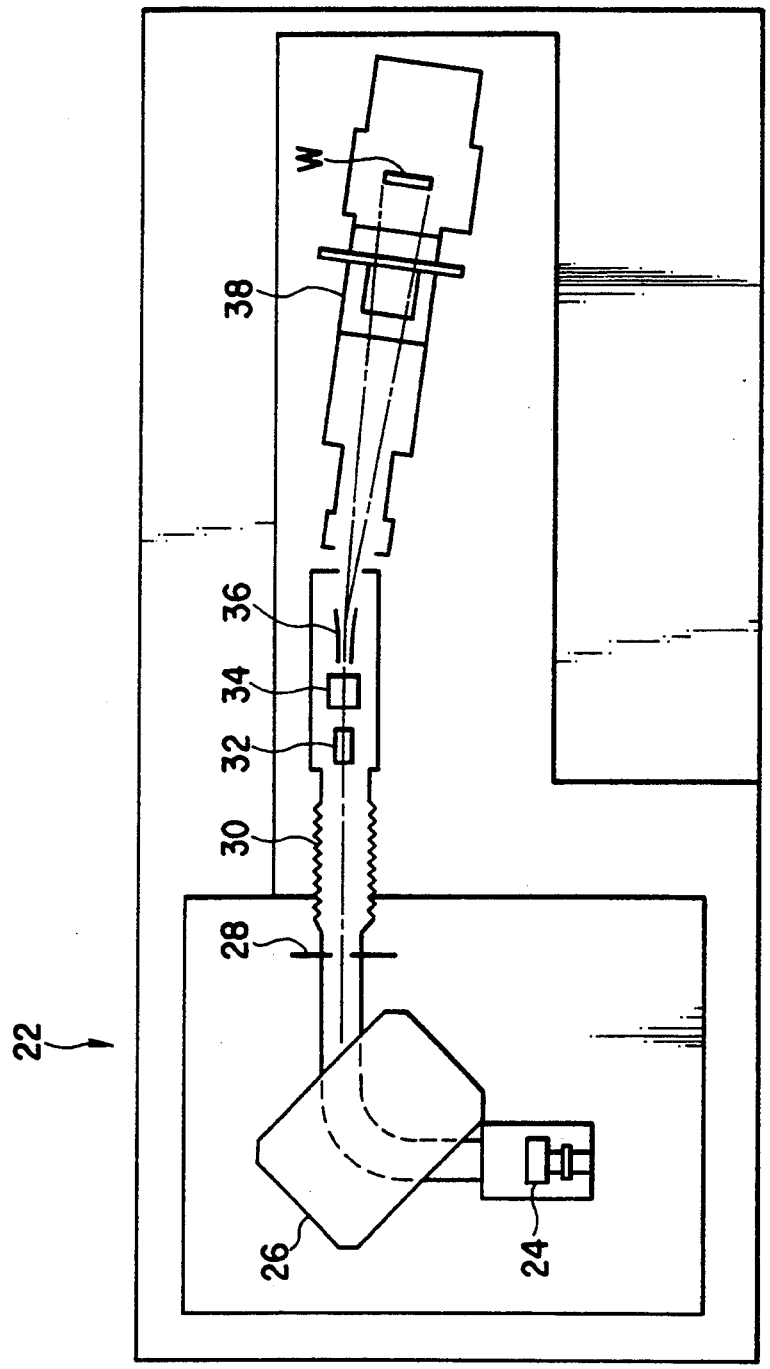
FIG. 2 is a schematic view of an ion injection unit.

The embodiment of the invention will be explained with reference to the accompanying drawings.

FIG. 1 shows an ion injection device according to the embodiment of the invention. The ion injection device denoted by reference numeral 10 comprises a vacuum chamber (treatment chamber) 12 for performing ion injection, an arm chamber 16 housing a transfer arm 14, a load lock chamber 18 provided on one side of the arm chamber 16, and a load lock chamber 20 provided on the opposite side of the chamber 18 for transferring wafers. The load lock chamber 18 has an atmosphere-side gate 19a and a vacuum-side gate 21a, both of which can be opened and closed. Similarly, the load lock chamber 20 has an atmosphere-side gate 19b and a vacuum-side gate 21b, both of which can be opened and closed. A gate 17 for opening and closing the vacuum chamber 12 is provided between the arm chamber 16 and vacuum chamber 12. The load lock chamber 18 also has an optical sensor 54 and a wafer-positioning mechanism 39 with a holding table 40.

An ion injector 22 is provided for injecting ions into a semiconductor wafer W placed on an injection disk (not shown) in the vacuum chamber 12. As is shown in FIG. 2, in the injector 22, a magnet 26 for performing mass analysis, a variable slit 28, and an accelerator tube 30 are located along the path of an ion beam generated from an ion source 24. Further, an electronic lens 32 and Y- and X-direction scanning electrodes 34 and 36 are located along the beam path on the beam-outlet side of the accelerator tube 30. An ion beam emitted from the ion source 24 passes through the magnet 26, whereby unnecessary impurity ions are removed from the beam. Then, the beam is accelerated through the accelerator tube 30 scanned with a predetermined pattern by the scanning electrodes 34 and 36, and emitted onto the semiconductor wafer W placed in a Faraday cup 38, thereby performing predetermined ion injection.

Then, the wafer-positioning mechanism 39, incorporated in the load lock chamber 18 located on the feed-in side of the ion injection device, will be explained.

As is shown in FIG. 3, the load lock chamber 18 houses a wafer holding table 40 being rotatable and movable in the vertical direction. There are provided a mechanism for rotating and lifting the table 40 and a wafer-position-measuring mechanism. Specifically, a body 42 defining the load lock chamber 18 has a cylindrical portion 42a projecting downward and containing a cylinder 46 with a bearing 44 interposed therebetween. The bearing 44 allows the cylinder 46 to rotate about its axis, and also serves as a magnetic seal. A lift 48 extends in the cylinder 46 along the axis thereof and can move in the vertical direction. The holding table 40 is mounted on the upper end of the lift 48. The cylinder 46 and lift 48 form a rotary shaft unit for rotating the holding table 40.

The lift 48 comprises a hollow member which communicates with the outside (atmosphere) and has a three-phase-current wire member 72 inserted therein. The core portion of the wire member 72 is connected to the terminals of the holding table 40, hereinafter referred to, at the upper end of the hollow member. The upper end of the lift 48 and the lower end of the holding table 40 are secured to each other with screws or the like, and sealed in an airtight manner with a seal member such as an O-ring. Further, a bellows 50 is provided between the lift 48 and cylinder 46 so as to surround the former. Thus, the load lock chamber 18 is kept airtight.

An air cylinder mechanism 46a is provided at a lower portion of the cylinder 46, for vertically moving the lift 48.

A window 52 is formed in a side wall of the load lock chamber 18 and covered with an optically transparent member. An optical sensor 54 is provided outside the window 52, for optically detecting the periphery of a wafer thereby to detect the direction of the orientation flat of the wafer and the position of the center of the same. An optical path, as indicated by the arrow, is formed by the optical sensor 54, and mirrors 56 and 58 provided above and below a peripheral portion of the wafer.

Figure 4:
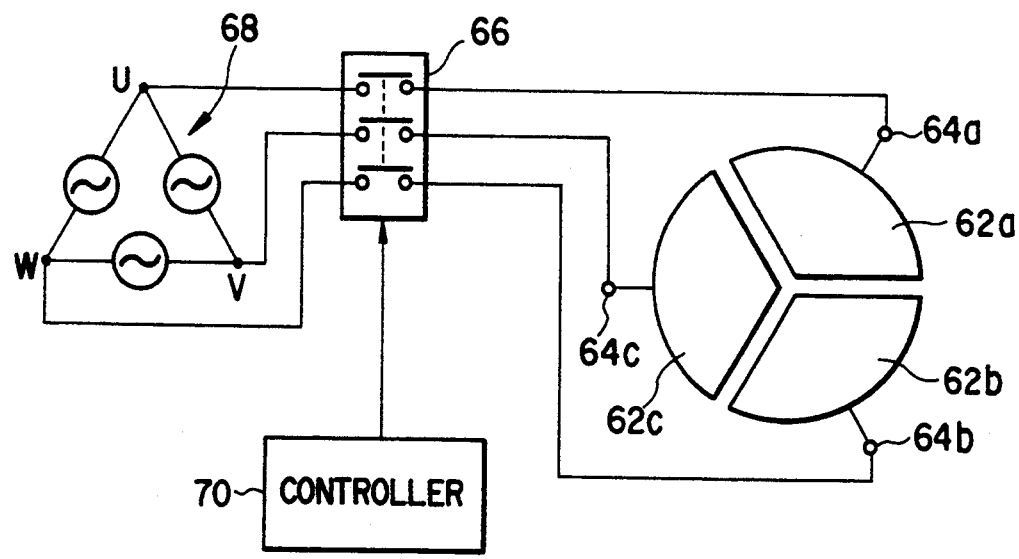
FIG. 4 is a wire diagram of an electrostatic chuck.
Figure 5:
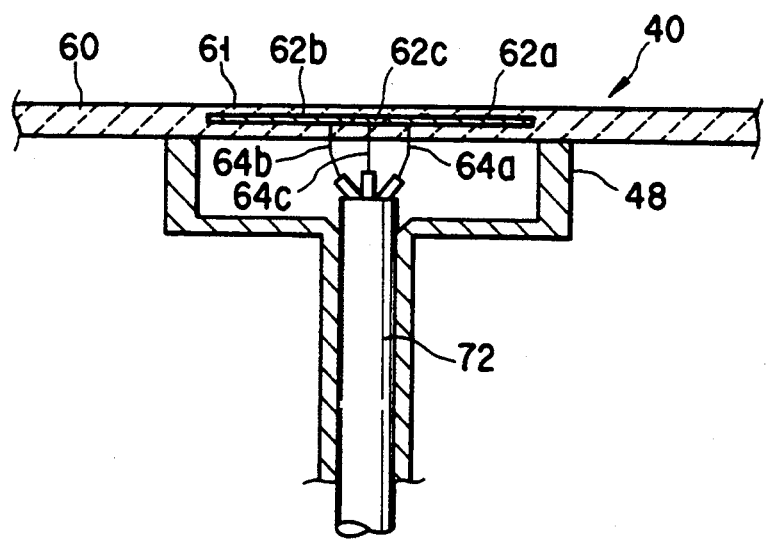
FIG. 5 is a cross sectional view of the electrostatic chuck.

As is shown in FIGS. 4 and 5, the holding table 40 comprises a base member 60 as a dielectric member made of ceramics. Fan-shaped electrodes 62a, 62b, and 62c having the same size and an inner angular of 120°, are buried in a central portion of the base member 60 at a location about 200 μm deep from the upper surface thereof. These electrodes are slightly separated from one another and form a circle member serving as a mechanism for electrostatically holding wafers.

As is shown in FIG. 4, the electrodes 62a-62c have terminals 64a-64c connected to U, V, and W phases of a three-phase-current source 68 via a three-phase switch unit 66, respectively. The switch unit 66 is on/off controlled by a controller 70 for controlling, for example, the overall ion injection treatment. Specifically, the unit 66 is turned on when a wafer is placed onto the holding table 40 by the transfer arm 14, and is turned off when it is lifted by the arm 14.

As is shown in, FIG. 5, the terminals 64a-64c extend into an upper hollow region in the lift 48 through the ceramics portions of the electrodes 62a-62c and holding table 40, and these extended portions are connected to the core portion of the three-phase-current wire member 72. In this embodiment, those portions of the base member 60 (dielectric member) which are located on the upper surfaces of the electrodes 62a-62c form a holding layer 61.

In the wafer-positioning mechanism constructed as above, when the wafer W is transferred into the load lock chamber 18 by a transfer arm (not shown) through the atmosphere-side gate 19a, the lift 48 is raised by the air cylinder mechanism 46a to bring the holding table 40 into contact with the lower surface of the wafer W. Thereafter, the holding table 40 is further raised to the position indicated by the one-dot-chain line shown in FIG. 3, thereby lifting and receiving the wafer W. Then, the transfer arm is retreated, and the table 40 is moved down to the position indicated by the solid line.

When the three-phase switch unit 66 is turned on by the controller 70 upon the holding table 40 receiving the wafer W, thereby electrically connecting the terminals 64a-64c to the U, V, and W phases of the three-phase-current source 68, the interphase voltage of the three-phase-current is applied between the electrodes 62a-62c, whereby electrostatic force acts upon the conductive wafer via the holding layer 61, and thus the wafer is electrostatically held by the holding layer 61. Since three-phase-current voltage is applied between the electrodes 62a-62c, i.e., voltage is alternately and continuously applied between each pair of the electrodes, the wafer W receives electrostatic force at all times and hence can reliably be held on the holding table.

Subsequently, the lift 48 is rotated by a driving mechanism (not shown), together with the cylinder 46, thereby causing one or more rotations of the wafer. The optical sensor 54 monitors the periphery of the wafer, and the direction of the orientation flat of the wafer and the position of the center of the same are detected by a data processing unit (not shown) incorporated in the controller 70, on the basis of monitoring results.

When examination of the wafer has been completed, the lift 48 is moved upward, and the wafer is transferred to the transfer arm 14, located on the vacuum treatment side, in a manner reverse to the above. At the time of the transfer of the wafer, the controller 70 turns off the three-phase switch unit 66 to release the electrostatic holding of the wafer. In this case, AC voltage is applied to the dielectric member, and hence the direction of the electronic field will be changed before dielectric polarization develops. Accordingly, the dielectric polarization is substantially small, and the electrostatic absorption force disappears instantly upon stopping the supply of voltage. Thereafter, the wafer is adjusted in position, and then transferred into the vacuum treatment chamber 12 by the transfer arm 14.

The junctions between the terminals 64a–64c of the electrodes 62a–62c and the tree-phase wire member 72 are located under the lower surface of the holding table 40, i.e., located outside the vacuum space. Hence, there is no fear of vacuum discharge. Further, the holding table 40 is removably secured to the lift 48, and thus can easily be replaced with a new one.

Then, the transfer arm, to be used for transferring the wafer from the load lock chamber to the vacuum treatment chamber will be explained.

As is shown in FIG. 6, the transfer arm 14 has a tip portion provided with a wafer holding member 74. The wafer holding member 74 comprises a platelike dielectric member having a thickness of e.g. 1–2 mm and made of ceramics, etc., as is shown in FIG. 7. Three electrodes 76a, 76b, and 76c extending in the longitudinal direction of the holding member 74 are buried in the member 74 at a location e.g. 200 µm deep from the surface thereof. In the embodiment, those parts of the holding member 74 which are located on the upper surfaces of the electrodes 76a–76c form a holding layer 77.

The electrodes 76a–76c have terminals 78a–78c electrically connected to U, V, and W phases of a three-phase-current source 81 via a three-phase switch unit 80, respectively.

Figures 8, 9:
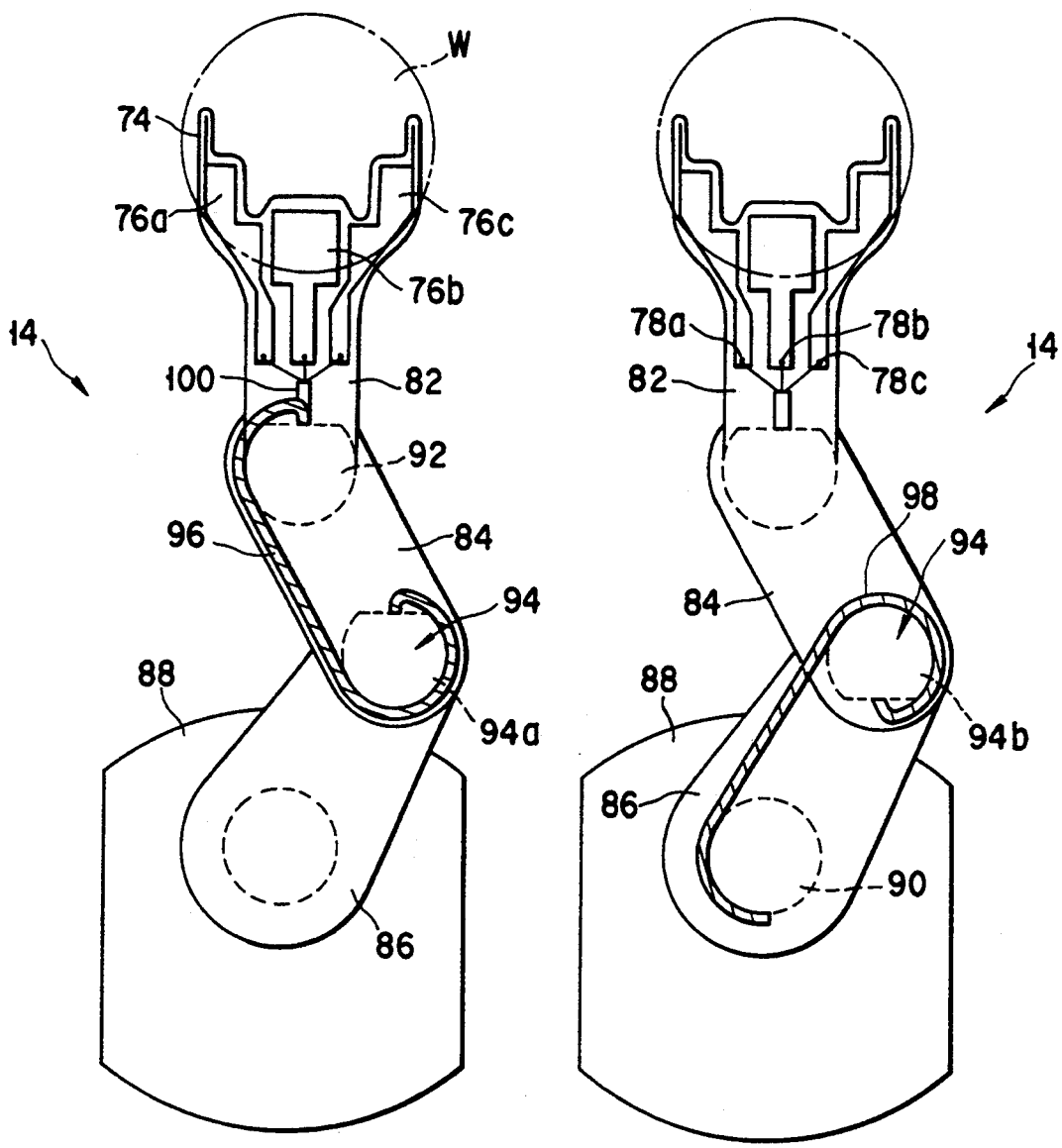
FIGS. 8 and 9 are views, showing a flexible printed board provided in the transfer arm.

As is shown in FIGS. 8 and 9, the transfer arm 14 is an articulated arm comprising first through third arm segments 82, 84, and 86. The third arm segment 86 is rotatably secured to a base 88. A stationary pulley 90 secured to the base 88 is mounted on a joint between the third arm segment 86 and base 88. A stationary pulley 92 secured to the first arm segment 82 is mounted on a joint between the first and second arm segments 82 and 84. Further, a rotatable pulley 94 is provided between the second and third arm segments 84 and 86 such that it can rotate relative to these segments.

The rotatable pulley 94 comprises e.g. interlocking upper and lower portions 94a and 94b. A first flexible printed circuit (FPC) 96 and a second FPC 98 are provided which serve as a three-phase- current path. The FPC 96 has one end connected to the stationary pulley 92 and the other end connected to the upper portion 94a of the rotatable pulley 94. The second FPC 98 has one end connected to the lower portion 94b of the rotatable pulley 94 and the other end connected to the stationary pulley 90. The first and second FPCs 96 and 98 are electrically connected to each other through the shaft of the rotatable pulley 94. Though the embodiment employs divided two FPCs, a single FPC can actually be used instead of the two. The end of the FPC 98 on the stationary pulley 90 is connected through the shaft of the base 88 to the three-phase switch unit 80 located outside.

On the other hand, in the first arm segment 82, a three-phase-current wire member 100 having an end connected to the FPC 96 is provided along the lower surface of the segment 82, and the core wires of the wire member 100 at the other end thereof are connected to the terminals 78a–78c projecting from the lower surface of the first arm segment 82.

By virtue of the above, wiring, rotation of the rotatable pulley 94 is controlled by the first and second FPCs 96 and 98 when the wafer W is transferred in the forward and backward directions of the transfer arm 14. Further, when the arm is folded, the FPCs 96 and 98 are loosened from the stationary pulleys 90 and 92, but at the same time are winded onto the rotatable pulley 94. Thus, the FPCs will not be loose.

In the embodiment, there is also provided an atmospheric pressure detector 102 in an arm chamber in which the transfer arm body is located. The detection result of the detector 102 and the instruction of the controller 70 for controlling the entire ion injection treatment are supplied to an interlock 106, which in turn supplies an output to the three-phase switch unit 80 to perform on/off control thereof.

The interlock 106 comprises a comparator 108 for outputting a lock instruction of e.g. logic "0" when the detection result of the atmospheric pressure detector 102 falls within a predetermined range, and an AND circuit 110 to be supplied with the instructions of the comparator 108 and controller 70. This processing also can be performed on the basis of software technique.

The above-described "predetermined range" of the atmospheric pressure corresponds to a range in which vacuum discharge is performed at that junction between the core wire member of the three-phase-current wire member 100 and the terminals 78a–78c which is exposed to the vacuum atmosphere. The predetermined range is obtained from experiments performed beforehand, and set as a range in which interlocking is made.

Specifically, in a case where an AC voltage of 2 KV is applied between the terminals 78a–78c, though the terminals can sufficiently be spaced from one another in the air so as not to cause discharge therebetween, vacuum discharge is very liable to occur within a certain range of vacuum pressure. Occurrence of vacuum discharge can hardly be prevented by only utilizing the gaps between the terminals. However, vacuum discharge will not occur below the lower limit of the certain vacuum pressure range. Such a vacuum pressure range varies depending upon the level of the voltage applied to the terminals 78a–78c. Therefore, it is necessary to beforehand measure the discharge range under the actual conditions and to adjust the comparator 108 so as to make the interlock function be effected within the measured range.

In the transfer device constructed as above, when the transfer arm 14 is moved into the load lock chamber 18 of the ion injection device to receive a wafer, and then receives the wafer on the wafer holding member 74 as shown in FIG. 7, the controller 70 outputs an instruction for turning on the three-phase switch unit 80.

If the pressure detected by the pressure detector 102 falls outside the predetermined range, the comparator 108 outputs a signal indicative of logic "1", whereby the interlock function is not effected, and the controller 70 supplies the three-phase switch unit 80 with an instruction to turn on the same. As a result, the power source 81 applies three-phase-current interphase voltage between the electrodes 76a–76c, so that the wafer W is electrostatically absorbed on the holding layer 77.

Since three-phase-current voltage is applied between the electrodes 76a–76c, i.e., voltage is alternately and continuously applied between each pair of the electrodes, the wafer W receives electrostatic absorption force at all times and hence can reliably be held on the holding member 74.

Subsequently, the wafer is transferred onto a predetermined portion of an injection disk (not shown) located in the vacuum treatment chamber 12, by rotating the base 88 and linearly moving the holding member 74 with the use of the arm segments 82–86. At the time of the transfer of the wafer onto the disk, the controller 70 turns off the three-phase switch unit 80 to thereby release the electrostatic holding of the wafer.

In the embodiment, AC voltage is applied to the dielectric member, and hence the direction of the electric field will be changed before dielectric polarization develops. Accordingly, the dielectric polarization is substantially small, and the electrostatic absorption force disappears instantly upon stopping the supply of voltage.

Where the junction between the terminals 78a–78c of the electrodes 76a–76c and the core wire member of the three-phase-current wire member 100 is exposed to the vacuum atmosphere, it is possible without the interlock 106 to use the transfer arm only outside the range in which vacuum discharge will occur. It is preferable, however, to employ the interlock 106 in order to reliably prevent short circuit.

The operation of the entire ion injection device of the invention will now be explained. The flowchart of FIG. 10 shows the process of transferring a wafer into the feed-in-side load lock chamber through the process of starting ion injection into the wafer.

Figure 10:
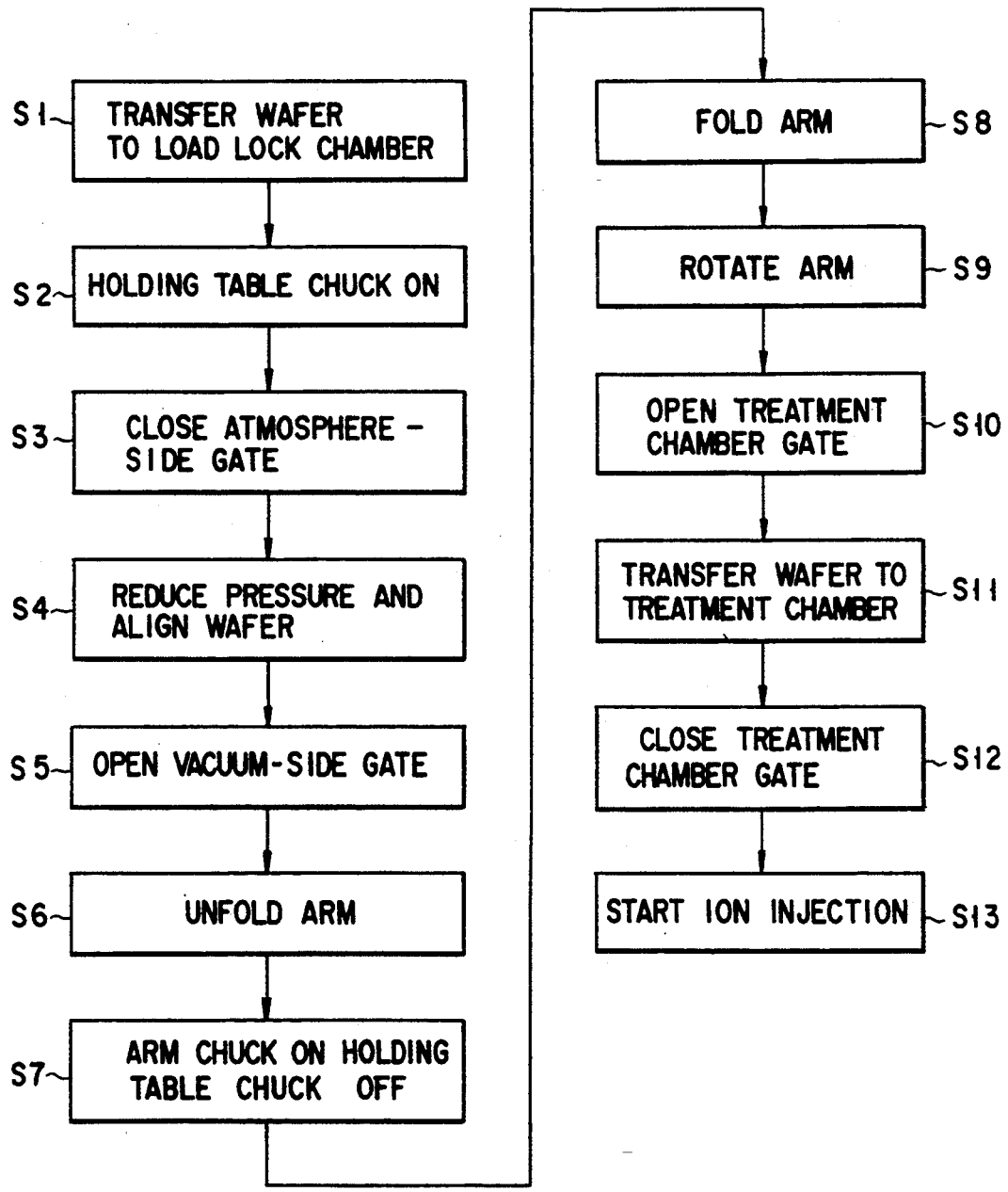
FIG. 10 is a flowchart showing the operation of the ion injection device.

As is shown in FIG. 10, in a step S1, the wafer W is transferred into the load lock chamber 18 and then onto the holding table 40 by means of the transfer arm exposed to the atmosphere. Then, in a step S2, the chuck of the holding table 40 is turned on, and in a step S3, the atmosphere-side gate 19a is closed. Subsequently, in a step S4, the pressure in the load lock chamber 18 is reduced, and simultaneously the position of the orientation flat of the wafer and the position of the center of the same are detected, thereby positioning the wafer.

when the pressure in the chamber 18 has been reduced and the wafer has been positioned, the process proceeds to a step S5, where the vacuum-side gate 21a is opened. In a step S6, the transfer arm 14 is unfolded to transfer the wafer W onto the holding member 74 of the arm. In a step S7, the chuck of the arm is turned on and the chuck of the holding table 40 is turned off.

When the transfer of the wafer W from the table 40 to the transfer arm 14 has been completed, the process proceeds to a step S8 where the arm 14 is folded, and then to a step S9 where the arm body 88 rotates. In a step S10, the gate 17 of the treatment chamber 12 is opened, and in a step S11 the wafer W is transferred into the vacuum treatment chamber 12 and then onto the injection disk. Where the wafer is placed on the disk, the treatment chamber gate 17 is closed in a step S12, and ion injection is started in a step S13.

When ions have been injected into the wafer W by means of the ion injection unit shown in FIG. 2, the treatment chamber gate 17 and vacuum-side gate 21b for feeding out the wafer are opened. Thus, the wafer W is transferred by the transfer arm 14 from the vacuum treatment chamber 12 to the feed-out-side load lock chamber 20. When the wafer W has been transferred into the chamber 20, the vacuum-side gate 21b is closed, and then air is introduced into the chamber 20. When the pressure in the chamber 20 is equal to the atmospheric pressure, the atmosphere-side gate 19b is opened, and the wafer W is fed out of the chamber 20 by means of an outside transfer arm (not shown).

Continuous ion injection into wafers is made by repeating the above-described process.

Though in the embodiment the wafer-positioning mechanism is incorporated in the load lock chamber, the invention is not limited to this, but may be modified such that the positioning mechanism is located in the treatment chamber.

Further, the wafer-positioning mechanism may have its electrical connecting portion exposed to the vacuum atmosphere, not to the air, and an interlock may be employed for interrupting, within a pressure range in which vacuum discharge will occur, the supply of voltage between the electrodes of the electrostatic holding member of the mechanism.

Though it is technically simple to bury the electrodes in the holding layer of the wafer-positioning mechanism, the invention is not limited to the technique if it has a structure such that the wafer is electrostatically held on a holding table.

In addition, short circuit can be prevented in the transfer arm even without the interlock, by locating in the air the junction between the three-phase-current wire member and the terminals of the electrodes in the following manner. A passage communicating with the outside is formed through the transfer arm provided in the ion injection device, and the three-phase-current wire member is inserted through the passage. Further, a hollow region is formed below the electrodes and at the end of the passage, in which hollow region the terminals of the electrodes are connected to the wire member.

If the electrical connecting portion of the transfer arm is completely molded so as to be isolated from the vacuum atmosphere, the arm can be used irrespective of the ambient pressure. In this case, however, there is a problem in the maintenance of the arm. To facilitate, for example, exchange of the wafer holding member of the arm segment, it is necessary to expose the connecting portion to the vacuum atmosphere or locate the same in the hollow region communicating with the air, and to removably attach the wafer holding member to the arm segment.

Moreover, in the invention, DC voltage may be applied between the electrodes. In this case, it requires a little time to remove the electrostatic force holding the wafer, depending upon the degree of the dielectric polarization occurring after the supply of voltage is stopped. Thus, DC voltage is applicable to a system which can manage even if treatment and/or transfer is performed not so quickly.

In the case of using AC voltage, a single-phase-current voltage may be applied between a pair of electrodes, or single-phase,current voltages, being out of phase, each may be applied between a corresponding one of two pairs of electrodes.

Also, the invention may employ a wafer holding table or wafer holding member which has a flexible dielectric film removably attached to its flexible base and having electrodes. By virtue of the film, the wafer holding table or portion can hold the uneven surface of a wafer.

The wafer-positioning mechanism and transfer arm of the invention are applicable in the air, as well as under vacuum.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A position detecting device comprising:
   a vacuum chamber in which an atmosphere is evacuated;
   a rotatable holding table provided in the vacuum chamber for holding a semiconductor wafer thereon;
   rotary driving means for rotating the holding table;
   detection means for detecting the position of the wafer;
   a holding portion provided on the holding table for electrostatically holding the wafer, the holding portion being made of a dielectric member;
   an electrode unit located below the holding portion substantially in parallel with an upper surface of the holding portion, the electrode unit having a plurality of electrodes separated from one another, the electrode unit including terminals;
   voltage application means for applying voltage between the electrodes through the terminals;
   control means for controlling the application and interruption of voltage between the electrodes; and
   means for isolating the terminals from the vacuum in the vacuum chamber to maintain the terminals at a pressure greater than that in the vacuum chamber and thereby prevent vacuum discharge across the terminals.

2. The ion injection device according to claim 1, wherein the electrode unit has at least three electrodes, and the voltage application means has means for continuously applying voltage between at least one pair of the electrodes.

3. The ion injection device according to claim 2, wherein the voltage application means includes a three-phase-current power source.

4. A position detecting device according to claim 1, further comprising:
   a hollow member which with the holding table defines an enclosed space communicating with an outer atmosphere and in which the terminals are disposed and exposed to said outer atmosphere.

5. A transfer device comprising:
   a holding member for holding an object to be transferred;
   a holding portion provided on the holding member for electrostatically holding the object, the holding portion being made of a dielectric member;
   an electrode unit located below the holding portion substantially in parallel with an upper surface of the holding portion, the electrode unit having a plurality of electrodes separated from one another;
   voltage application means for applying voltage between the electrodes;
   control means for controlling the application and interruption of voltage between the electrodes;
   a chamber containing the holding member, which can be evacuated to create a vacuum state therein;
   pressure detection means for detecting pressure in the chamber; and
   interlock means for interrupting the supply of voltage between the electrodes when the pressure in the chamber falls within a predetermined range.

6. The transfer device according to claim 5, wherein the electrode unit has at least three electrodes, and the voltage application means has means for continuously applying voltage between at least one pair of the electrodes.

7. The transfer device according to claim 6, wherein the voltage application means includes a three-phase-current power source,

* * * * *